United States Patent [19]
Yang et al.

[11] Patent Number: 6,036,356
[45] Date of Patent: Mar. 14, 2000

[54] IN-SITU SLURRY MIXING APPARATUS

[75] Inventors: Ming-Sheng Yang, Hsinchu; Chien-Hsin Lai, Kaohsiung Hsien; Chia-Jui Chang, Keelung; Juan-Yuan Wu, Hsinchu, all of Taiwan

[73] Assignee: United Microelectronics Corp., Taipei, Taiwan

[21] Appl. No.: 09/220,147

[22] Filed: Dec. 23, 1998

[51] Int. Cl.⁷ ...................................................... B01F 5/00
[52] U.S. Cl. ............................................. 366/241; 366/341
[58] Field of Search ................................. 366/181.5, 241, 366/336, 338, 341, 342, 343, 349; 138/37, 40; 48/189.4

[56] References Cited

U.S. PATENT DOCUMENTS

| | | |
|---|---|---|
| 1,170,807 | 2/1916 | Egan . |
| 2,426,833 | 9/1947 | Lloyd . |
| 3,995,663 | 12/1976 | Perry . |
| 4,384,789 | 5/1983 | Avery, Jr. ................................. 366/341 |
| 4,929,088 | 5/1990 | Smith ......................................... 138/40 |
| 5,397,179 | 3/1995 | Berlin et al. ............................ 366/336 |

*Primary Examiner*—Charles E. Cooley
*Attorney, Agent, or Firm*—Thomas, Kayden, Horstemeyer & Risley

[57] ABSTRACT

An in-situ CMP slurry mixing apparatus. The apparatus comprises a tubular main body and a plurality of tapered plugs. The tubular main body further comprises a plurality of first tubes with a first diameter, a plurality of second tubes with a second diameter. Each tapered plug is placed in each second tube, the tips of each tapered plug are pointed in the same direction, and the tips are each oriented opposite to a flowing direction of a CMP slurry. In addition, the second diameter is larger than the first diameter, and a diameter of the base of each tapered plug is larger than the first diameter but is smaller than the second diameter.

18 Claims, 3 Drawing Sheets

IN-SITU SLURRY MIXING APPARATUS

BACKGROUND OF THE INVENTION

1. Field of the Invention

The invention relates to chemical mechanical polishing (CMP) polisher and more particularly to an in-situ slurry mixing apparatus for the CMP polisher.

2. Description of the Related Art

Due to the increasingly high integration of ICs, chips simply cannot provide sufficient area for manufacturing interconnections. Therefore, in accord with the increased interconnects manufacturing requirements of miniaturized MOS transistors, it is increasingly necessary for IC manufacturing to adopt a design with more than two metal layers. Planarization is an important technology in semiconductor process. The surface of the wafer has an even topography after planarization and it is able to prevent exposure light source from being scattered, so that the pattern transfer can be carried out precisely. Additionally, planarization is also a main factor that affects the accuracy of the alignment system. If the flatness of the wafer is poor, the mask cannot be aligned the wafer by the alignment system and the probability of making mistakes in the process is increased.

CMP is currently the only process that can provide global planarization in very large scale integration (VLSI) and ultra-large scale integration (ULSI). CMP is a planarization process that planarizes an uneven surface by applying mechanical polishing and adding a suitable chemical reagent called slurry. Generally. slurry is formed by a composition of the abrasive particles such as colloidal silica or dispersed alumina and a basic solution such as potassium hydroxide solution or ammonium.

The quality of the slurry determines the stability of the process, so it is important in the planarized process of CMP. Chemical reaction and mechanical polishing are determined by chemical reagent and particles in the slurry, respectively. The slurry first needs to be diluted by solvent, after which it is ready for use, so that the slurry is varied depending of the material to be polished, and it is often necessary to use two kinds of slurry to planarize a wafer.

Since the slurry needs to be diluted to a suitable concentration, a premixer is added in the slurry supplier to mix slurry in advance. However, the property of the slurry may easily change after mixing. Thus, the slurry has to be consumed after being mixed and before reaching a Pot life. Due to the instability of the pre-mixed slurry, another in-situ slurry mixing apparatus is developed. However, the mixing time of the in-situ slurry mixing apparatus is too short to uniformly mix the slurry, so that the quality of the slurry cannot be easily controlled. Moreover, the nonuniform mixing slurry would result in a worse CMP performance, so that the flatness of the wafer is poor and misalignment occurs easily.

SUMMARY OF THE INVENTION

It is therefore an objective of the invention to provide an in-situ mixing apparatus that improves the mixing efficiency of the fluid.

It is another an objective of the invention to provide an in-situ mixing apparatus for supplying CMP slurry that maintains the rate stability of the CMP device.

To achieve these and other advantages and in accordance with the purpose of the invention, as embodied and broadly described herein, the invention provides an in-situ fluid mixing apparatus. The apparatus comprise a tubular main body having a plurality of first tubes with a first diameter, a of plurality second tubes with a second diameter. The second tubes are alternately linked with the first tubes. A plurality of tapered plugs, wherein each tapered plug is placed in each second tube and the tip of each tapered plug is pointed in the same direction. The tips are each oriented opposite to a flowing direction of a fluid flowing into the tubular main body.

The apparatus may also comprise a tubular main body having a plurality of first tubes with a first diameter, a plurality of second tubes with a second diameter. The second tubes are alternately linked with the first tubes. A plurality of tapered plugs, wherein each tapered plug is placed in each second tube and the tip of each tapered plug is pointed in the same direction. The tips are each oriented opposite to a flowing direction of a CMP slurry and the tapered plugs are denser than the CMP slurry.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
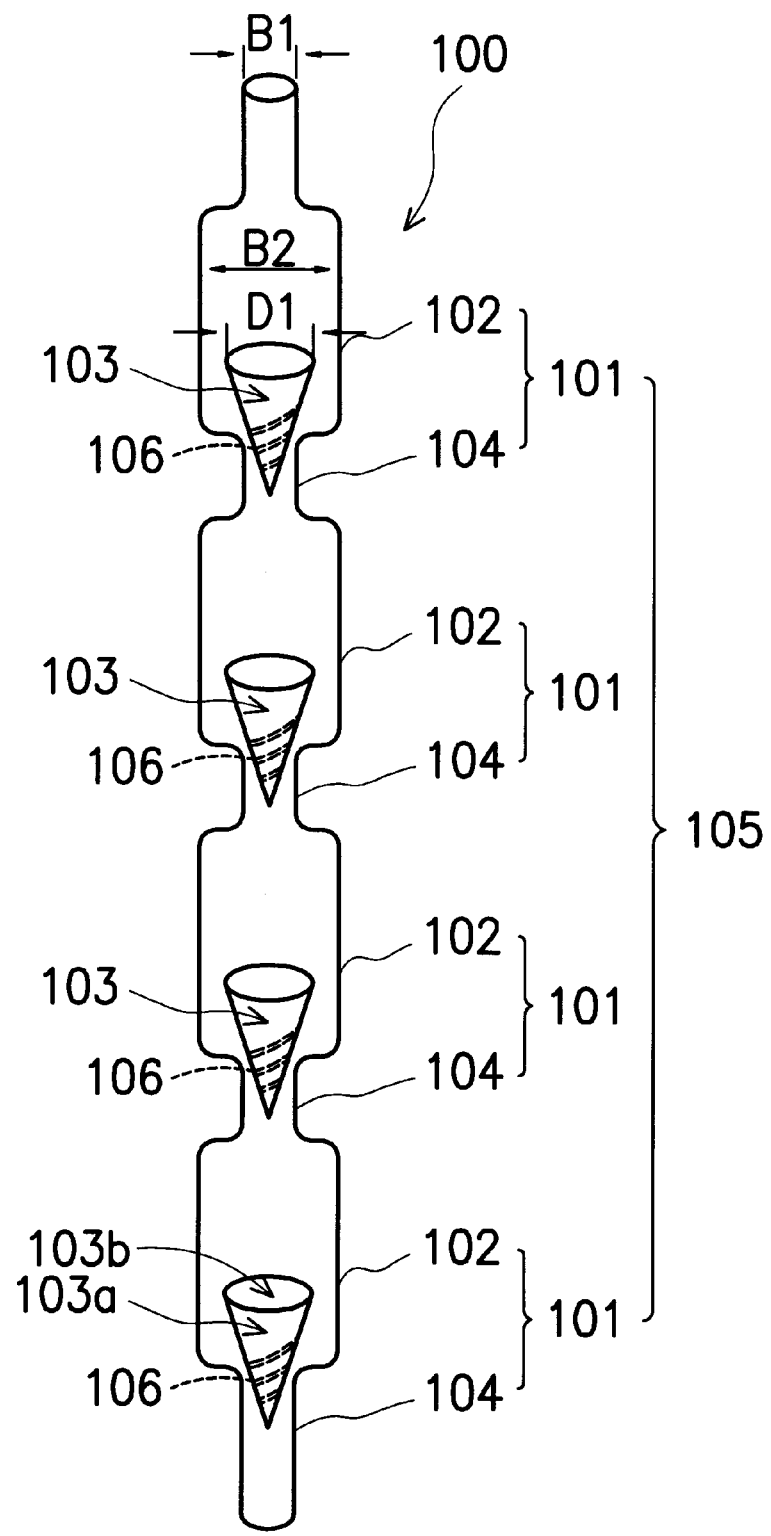
FIG. 1 is schematic, cross-sectional view of the fluid supplier apparatus in a preferred embodiment according to the invention.

Reference will now be made in detail to the present preferred embodiments of the invention, examples of which are illustrated in the accompanying drawings. Wherever possible, the same reference numbers are used in the drawings and the description to refer to the same or like parts.

The invention provides a fluid supplier apparatus having a mixing function, especially for supplying CMP slurry.

FIG. 1 is schematic, cross-sectional view of the fluid supplier apparatus in a preferred embodiment according to the invention.

As shown in FIG. 1, a fluid supplier apparatus 100 having an in-situ mixing function is used to mix different kinds of slurry immediately. The fluid supplier apparatus 100 comprises a tubular main body 105. The tubular main body comprises at least one unit 101, which in turn comprises a relatively large tube 102 and a relatively small tube 104. The fluid supplier apparatus 100 further comprises at least one tapered plug 103. The diameters of the tubes 102 and 104 are B2 and B1 respectively. The tips of each tapered plug 103 are pointed in the same direction. The tapered plug 103 can be a conical plug, for example, which comprises a cone surface 103a and a base 103b. The diameter D1 of the base 103b of the tapered plug 103 is larger than the diameter B1 but is smaller than the diameter B2. Hence, each tapered plug 103 obstructs each tube 104 as no fluid is presented in the apparatus 100. Moreover, the tapered plug 103 is in the tube 102 and cannot pass through the tube 104. Additionally, since the length of the tapered plug 103 is greater than the diameter B2, the tapered plug 103 cannot be inverted in the tube 102. The greater the number of tubes 102 used in the unit length of the apparatus 100 is, the more uniform the mixed fluid will be. In this example, preferably, taking the conical plug as example. The conical plug has screw threads 106 along the conical surface 103a, so that convolution occurs when the fluid passes through the screw threads and the mixing efficiency is improved. The tubular main body 105 of alternate tubes 102 and 104 can be an integral structure or the tubes 102 are alternately coupled to the tubes 104, for example.

A denoted description of the application to supply a CMP process a slurry by this fluid supplier apparatus 100 is presented as follows.

FIG. 1 is a schematic, cross-sectional view of the fluid supplier apparatus 100 in a state where either the CMP slurry in the apparatus is logged or the CMP slurry is not present in the apparatus. The tip of each tapered plug 103 obstructs the tube 104 and points towards the earth when the apparatus 100 is in used. Since the CMP slurry is caustic, the tapered plug 103 and the tubes 102 and 104 are made of acid/base-resistant material, such as Teflon or the like.

Typically, since the CMP slurry is driven by a pulse-type pump (not shown), the mechanism of the apparatus 100 delivering the CMP slurry is divided into two parts: one is at the pumping pulse-on and the other is at the pumping pulse-off. In this example, the CMP slurry flows in a direction as shown by the arrows 200 in FIGS. 2A and 2B.

Figure 2A:
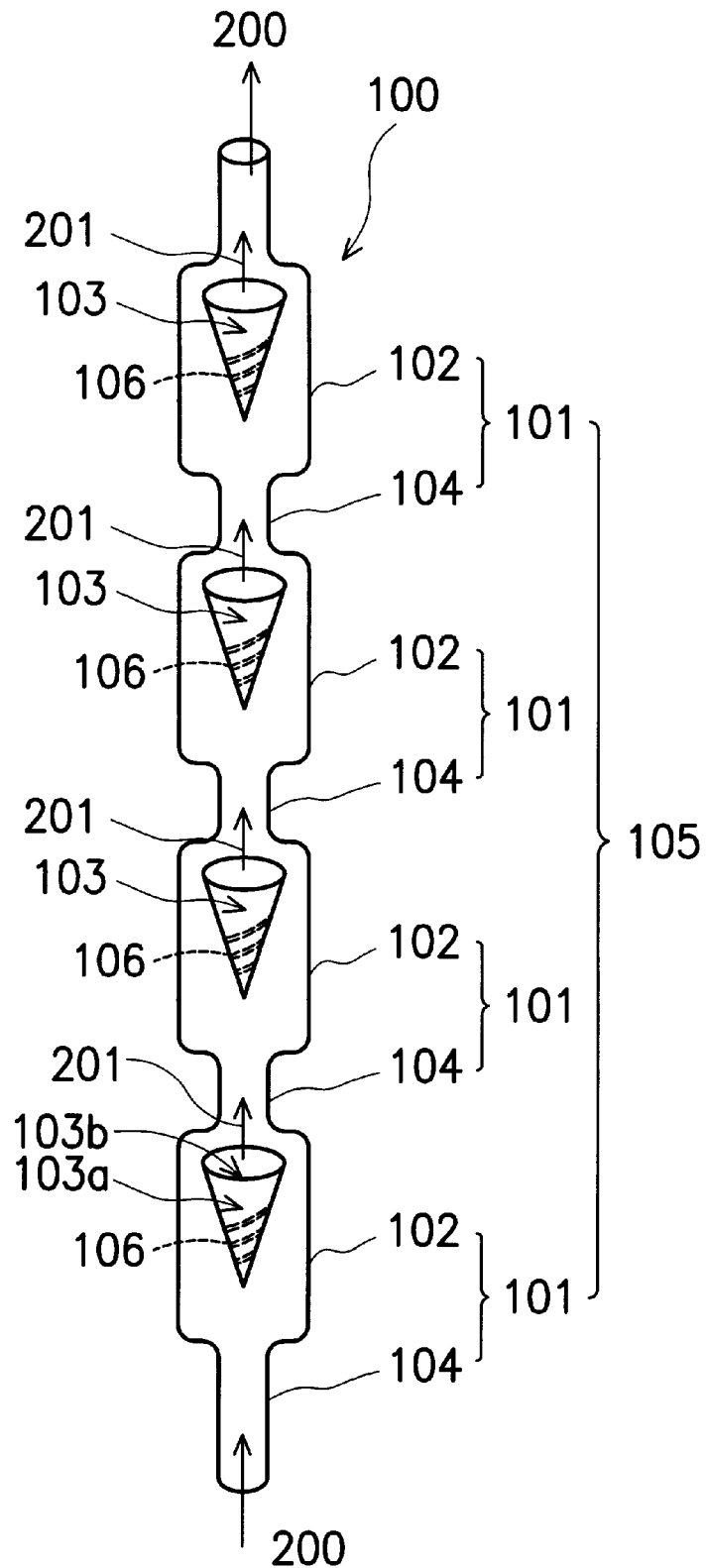
FIG. 2A is schematic, cross-sectional view of the fluid supplier apparatus during the pump pulse on in a preferred embodiment according to the invention.

As shown in FIG. 2A, the CMP slurry flows into the apparatus 100 as a direction shown by the arrow 200 during the pump pulse-on. The tapered plug 103 is forced to move by the CMP slurry in a direction shown by an arrow 201 that is the same as the direction shown by the arrow 200.

Figure 2B:
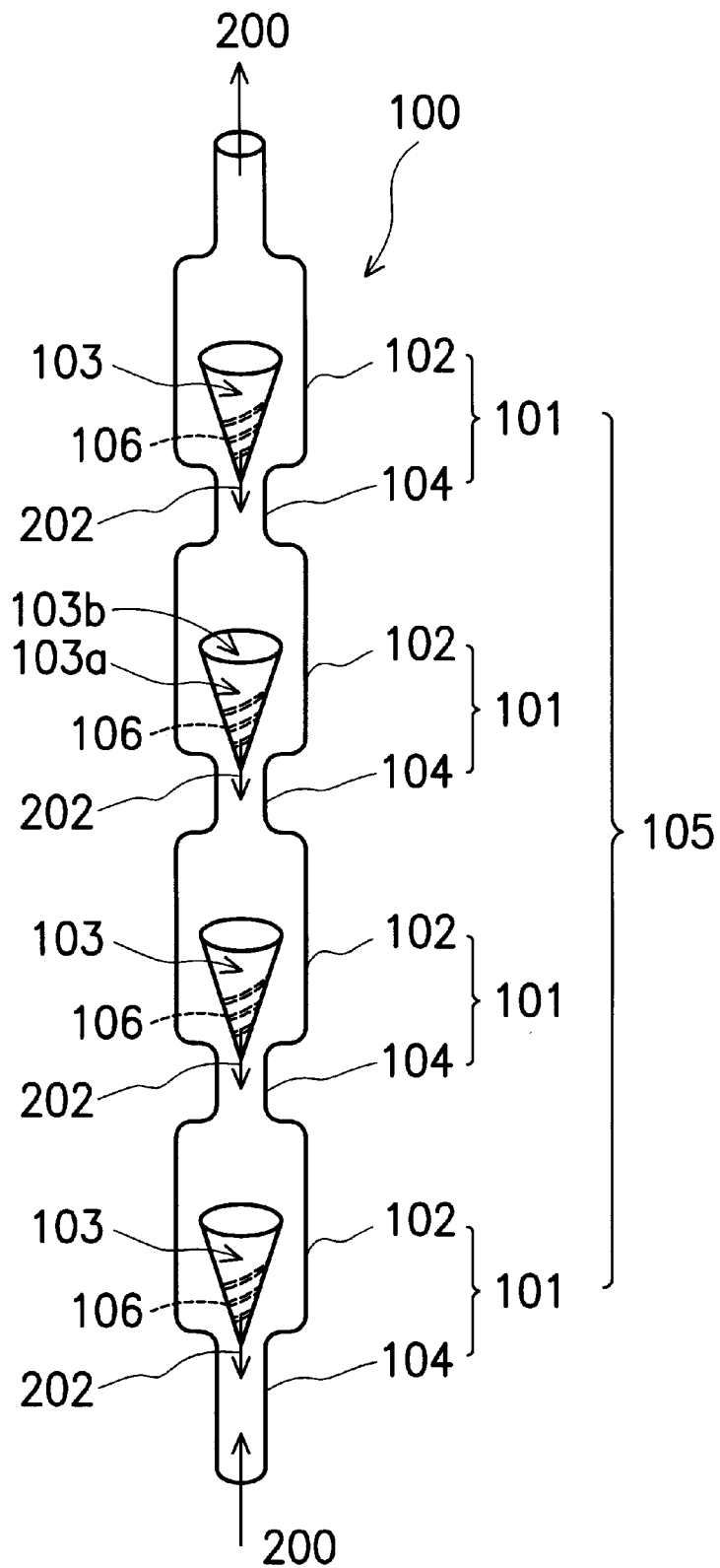
FIG. 2B is schematic, cross-sectional view of the fluid supplier apparatus during the pump pulse off in a preferred embodiment according to the invention.

As shown in FIG. 2B, the CMP slurry is no longer flowing into the apparatus 100 during the pump pulse-off, and the tapered plug 103 settles to obstruct tube 104 in a direction shown by an arrow 202 that is opposite to the direction shown by the arrow 200 as the density of the tapered plug 103 is larger than that of the CMP slurry. While the tapered plug 103 is falling to obstruct the tube 104, the CMP slurry in the apparatus 100 is pushed in a direction opposite to the arrow 202 and stirred. Preferably, the slurry flows through the screw threads along the conical surface and forms convolutions. Hence, the CMP slurry can be mixed uniformly.

When the apparatus 100 is used to supply the CMP slurry, different kinds of CMP slurry also can be well mixed by the apparatus 100. Besides this, the apparatus 100 is especially suitable for the in-situ slurry-mixing device to maintain the stability of the polishing rate.

Altogether, the present invention includes the following advantages:

1. The invention provides an apparatus having a mixing function. The apparatus can be coordinated with a pulse-type pump to deliver fluid. When the combination fluid flows into the apparatus, the combination fluid can be stirred by the apparatus to produce a uniform mixture.

2. The invention providing an apparatus having a mixing function is suitable for an in-situ fluid-mixing device 3. The invention provides an apparatus having a mixing function. The apparatus is not only used to supply fluid, but also used to supply gas etc.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An in-situ fluid mixing apparatus, comprising:

a tubular main body having a plurality first tubes with a first diameter and a plurality of second tubes with a second diameter, wherein the second tubes are alternately linked with the first tubes; and a plurality of tapered plugs, wherein each tapered plug comprises a base, and each tapered plug is placed in one of the second tubes with a tip pointing in a same direction, the tips are each oriented opposite to a flowing direction of a fluid flowing into the tubular main body.

2. The apparatus of claim 1, wherein the tubular main body is an integral structure.

3. The apparatus of claim 1, wherein the second tubes are alternately coupled to the first tubes.

4. The apparatus of claim 1, wherein the second diameter is larger than the first diameter.

5. The apparatus of claim 1, wherein the diameter of the base of the tapered plugs is larger than the first diameter but is smaller than the second diameter.

6. The apparatus of claim 5, wherein the surface of each tapered plug excluding the base surface has screw threads used to produce a fluid convolution.

7. The apparatus of claim 1, wherein the plurality of tapered plugs includes a plurality of conical plugs.

8. The apparatus of claim 1, wherein the height of each tapered plug is larger than the second diameter.

9. An in-situ CMP slurry mixing apparatus for mixing a CMP slurry, comprising:

a tubular main body having a plurality of first tubes with a first diameter and a plurality of second tubes with a second diameter, wherein the second tubes are alternately linked with the first tubes; and a plurality of tapered plugs, wherein each tapered plug comprises a base, and each tapered plug is placed in one of the second tubes with a tip pointing in a same direction, the tips are each oriented opposite to a flowing direction of a CMP slurry, and each tapered plug is denser than the CMP slurry in the tubular main body.

10. The apparatus of claim 9, wherein the second diameter is larger than the first diameter.

11. The apparatus of claim 9, wherein each of the diameter of the base of the tapered plugs is larger than the first diameter but is smaller than the second diameter.

12. The apparatus of claim 9, wherein each of the tapered plugs includes a plurality of conical plugs.

13. The apparatus of claim 12, wherein the surface of each tapered plug excluding the base surface has screw threads used to produce a fluid convolution.

14. The apparatus of claim 9, wherein material of the tapered plugs includes Teflon.

15. The apparatus of claim 9, wherein material of the tubular main body includes Teflon.

16. The apparatus of claim 9, wherein the tubular main body is an integrated structure.

17. The apparatus of claim 9, wherein the second tubes are alternately coupled to the first tubes.

18. The apparatus of claim 9, wherein the height of each tapered plug is larger than the second diameter.

* * * * *